United States Patent
Garofalo

(10) Patent No.: US 11,942,958 B2
(45) Date of Patent: Mar. 26, 2024

(54) METHOD FOR COMPENSATING ELECTRICAL DEVICE VARIABILITIES IN CONFIGURABLE-OUTPUT CIRCUIT AND DEVICE

(71) Applicant: Micron Technology, Inc., Boise, ID (US)

(72) Inventor: Pierguido Garofalo, San Donato Milanese (IT)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/846,683

(22) Filed: Jun. 22, 2022

(65) Prior Publication Data
US 2022/0329251 A1    Oct. 13, 2022

Related U.S. Application Data

(63) Continuation of application No. 16/760,750, filed as application No. PCT/IB2019/001113 on Oct. 30, 2019, now Pat. No. 11,387,836.

(51) Int. Cl.
   *H03M 1/06* (2006.01)
(52) U.S. Cl.
   CPC ................ *H03M 1/0648* (2013.01)
(58) Field of Classification Search
   CPC .................................................. H03M 1/0648
   See application file for complete search history.

(56) References Cited

U.S. PATENT DOCUMENTS

| | | | |
|---|---|---|---|
| 6,911,930 B1 | 6/2005 | Da Dalt et al. | |
| 7,804,433 B1 * | 9/2010 | Haroun | H03M 1/1033 341/120 |
| 10,600,378 B2 * | 3/2020 | Ito | G02F 1/13306 |
| 10,848,171 B1 * | 11/2020 | Carey | H03K 19/017509 |
| 11,387,836 B2 | 7/2022 | Garofalo | |
| 2003/0090402 A1 | 5/2003 | Nagao | |
| 2006/0176203 A1 * | 8/2006 | Grosso | H03M 1/70 341/144 |
| 2010/0006645 A1 | 1/2010 | Drummond et al. | |
| 2010/0066455 A1 * | 3/2010 | Kamath | H03M 1/68 341/145 |
| 2013/0271305 A1 * | 10/2013 | Kim | H03M 1/0863 341/154 |

(Continued)

OTHER PUBLICATIONS

A. I. Konstantinov et al., "Efficiency analysis of techniques for weighting elements arrangement on the chip of unary digital-to-analog converter", Radioelectronics and Communications Systems, vol. 60, pp. 225-232, Jun. 16, 2017.

(Continued)

*Primary Examiner* — Lam T Mai
(74) *Attorney, Agent, or Firm* — Greenberg Traurig

(57) ABSTRACT

A method has been disclosed that relates to electrical variability compensation technique for configurable-output circuits. The compensation technique can be applied to a generality of circuits whose output has to vary between two electrical limits spanning the range in between them according to a specific code given as input. A switching sequence that is process gradient-direction agnostic has been disclosed which limits variability. An electric device comprising a processing gradient-direction agnostic configurable-output circuit has been also disclosed.

20 Claims, 13 Drawing Sheets

(56) References Cited

U.S. PATENT DOCUMENTS

| | | | |
|---|---|---|---|
| 2015/0042498 A1 | 2/2015 | Onody et al. | |
| 2015/0102949 A1* | 4/2015 | Rajasekhar | H03M 1/08 341/118 |
| 2016/0094235 A1* | 3/2016 | Kuttner | H03M 1/662 341/144 |
| 2018/0335792 A1* | 11/2018 | Kuchipudi | G06F 1/266 |
| 2021/0159906 A1* | 5/2021 | Singh | H03M 3/422 |
| 2021/0159907 A1* | 5/2021 | Singh | H03M 1/1033 |
| 2021/0391868 A1 | 12/2021 | Garofalo | |

OTHER PUBLICATIONS

International Search Report and Written Opinion, PCT/IB2019/001113, dated Jul. 23, 2020.

Yonghua Cong et al., "Switching sequence optimization for gradient error compensation in thermometer-decoded DAC arrays", IEEE Transactions on Circuits and Systems II: Analog and Digital Signal Processing, vol. 47, Issue 7, Jul. 31, 2000, pp. 589-590.

* cited by examiner

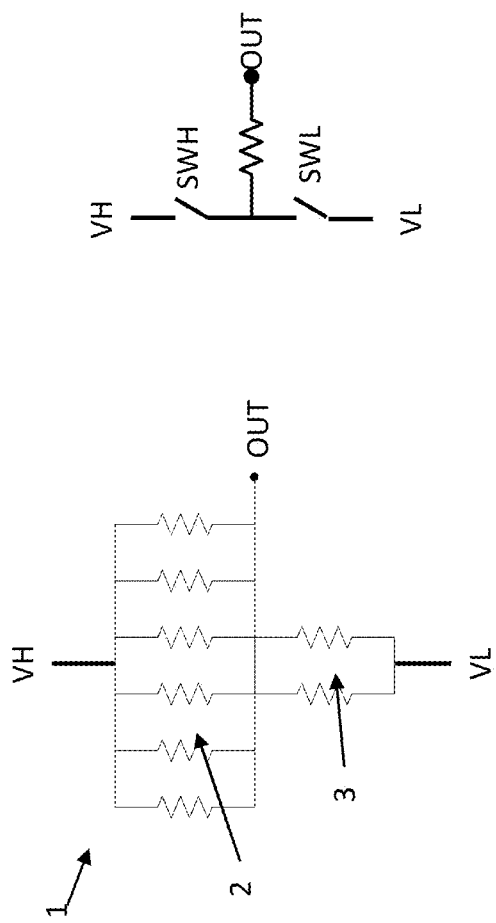
FIG. 1 – PRIOR ART
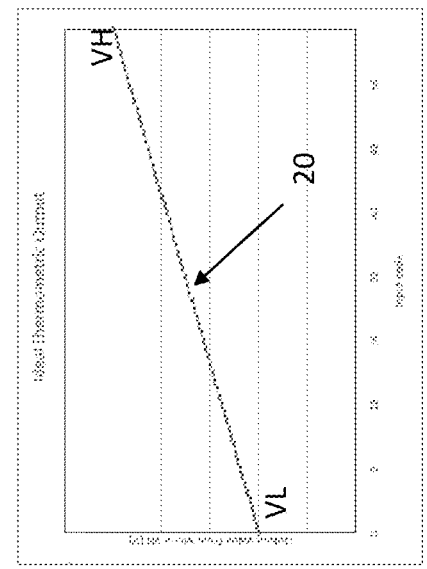
FIG. 2

METHOD FOR COMPENSATING ELECTRICAL DEVICE VARIABILITIES IN CONFIGURABLE-OUTPUT CIRCUIT AND DEVICE

RELATED APPLICATIONS

The present application is a continuation application of U.S. patent application Ser. No. 16/760,750 filed Apr. 30, 2020 and issue as U.S. Pat. No. 11,387,836 on Jul. 12, 2022, which is a national phase application of Int. Pat. App. No. PCT/IB2019/001113 filed Oct. 30, 2019, the entire disclosures of which applications are hereby incorporated herein by reference.

TECHNICAL FIELD

The present invention relates generally to the field of electrical devices and more specifically to configurable output circuits and electrical device variability compensation techniques for configurable output circuits.

BACKGROUND

As it is well known in this technical field, the digital signal processing brought a large revolutionary change in the world of data communication with the invention of numerous techniques of digital to analog conversion. A digital to analog converter involves the transformation of discrete digitized signal into non-discrete or continuous signal. Data converters are utilized almost in every field of communication; for instance, satellite communication, wireless communication, optical fiber communication and digital communication. Other fields are electrical measurements, robotics and whenever a variable reference is needed.

During most recent years, various techniques have been implemented to a generality of electrical devices or circuits whose output has to vary between two electrical limits spanning the range in between them according to a specific code given as input.

For instance, a generic electric device or circuit may include a first set of electrical components that is coupled to a first one of two electrical variables, for instance a biasing reference voltage, while another subset of second electrical components is coupled to a second electrical variable, for example another reference voltage, such as a ground voltage. A common terminal provides the output of the whole circuit.

The configuration of the two subsets of electric components may vary according to a specific set of input signal. The input-output relation however deviates from the ideal case due to possible deviation of each of the real components from the nominal electrical value.

In other words, the actual disposition of the electric components inside the circuit has an impact on the value of the circuit output for a given coded input.

Moreover, the scaling of the electronic devices has paved way for new challenges in the form of increased variability, which is regarded as the major roadblock in the further scaling of the electronic devices. Furthermore, for the improvement of the performance and/or reduction of cost, electrical devices or circuits are designed to operate in conditions which are more sensitive to variations.

Variability holds maximum importance when electrical devices or circuits are created from an assembly of millions of components comprising minute quantities of material as in the manufacture of VLSI electrical devices or circuits. The variability may even lead to the failure of the devices.

A purpose of the present disclosure is that of providing a solution for compensating electrical device variabilities in configurable output circuits realized on a semiconductor substrate.

BRIEF DESCRIPTION OF THE DRAWINGS

The embodiments of the present disclosure will be better understood from the following detailed description with reference to the enclosed drawings, in which:

FIG. 1 shows a schematic view illustrating an example of a circuit device, for instance a TDAC (Thermometric Digital to Analog Converter), structured according to the prior art;

FIG. 2 shows an example of a diagram illustrating an ideal output response of a TDAC circuit device structured as in FIG. 1 but spanning conversions obtained by 63 resistive components when biased according to predetermined input values;

FIG. 3 shows a square matrix 8×8 wherein each cell is indicative of a resistance value of a TDAC circuit device including 64 resistive components and wherein the respective resistance values increase from the first top row to the last bottom row of the matrix. The number associated to each resistive component indicates the sequence be which the resistive components are switched from VL to VH reference voltages;

FIG. 5 show a square matrix 8×8 wherein each cell is indicative of a resistance value of a TDAC circuit device including 63 resistive components and wherein the biasing sequence is mirrored if compared to the example of FIG. 3;

DETAILED DESCRIPTION

Figure 4:
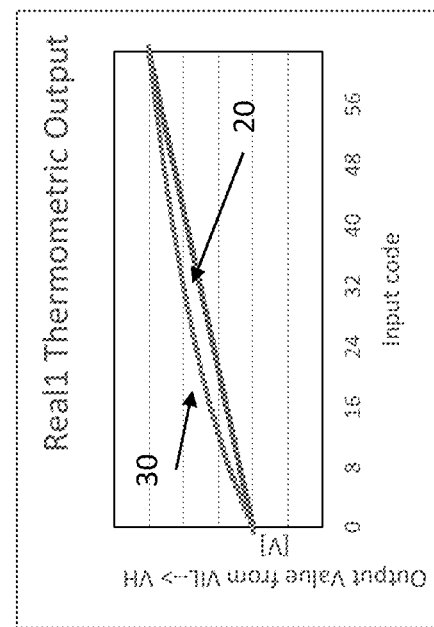
FIG. 4 shows a schematic diagram referred to FIG. 3 and illustrating a possible real output response of a TDAC circuit device structured as in FIG. 1 but including at least 63 resistive components when biased according to predetermined input values.

The present disclosure will refer to a method and device for compensating electrical device variabilities in configurable output circuits realized on a semiconductor substrate.

Just as an example, the method is applied to a circuit structure including a plurality of electric components such as resistive elements, but nothing prevents from applying the teachings of the present disclosure to other kind of electronic components such as capacitive elements or inductive elements or even transistors.

It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

The embodiments herein and the various features and advantageous details thereof are explained more fully with reference to the non-limiting embodiments that are illustrated in the accompanying drawings and detailed in the following description.

Descriptions of well-known components and processing techniques are omitted to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein The principle of the present disclosure may be adopted for interconnected passive electronic components as well as for active electronic components realized inside integrated circuits manufactured on a semiconductor substrate and subject to possible process variations that may modify their characteristic if compared to a nominal ideal value.

For a better understanding of the present disclosure, it should be first remarked that variations can be classified as uncontrollable (random) variations and controllable (systematic) variations which are topologically dependent.

The random variations are uncontrollable and can be spontaneous, which changes the function of the electrical devices but is outside the scope of the present disclosure.

On the contrary, controllable or systematic variation can be tuned for the desired optimum performance of the electrical devices. The controllable or systematic variation can be depicted, in some cases, as a surface gradient affecting the electrical behavior of the devices, according to the geometrical disposal of its components.

Generally speaking the device or circuit components are arranged in the most possible compact area, i.e. a rectangle "tending to a square" or a square. The intensity of the surface gradient is related to the poorness of the process, electrical variations by mechanical stress, electrical bias dependence of the device characteristics.

FIG. 1 schematically shows a TDAC (Thermometric Digital to Analog Converter) but the idea underlining the present disclosure may also be applied to other kinds of circuits based on switching a series of device components from an electrical level to another level.

Just as an example, a TDAC is a circuit made by a set of resistive components sharing a common terminal OUT, the output of the DAC.

For instance, FIG. 1 shows a schematic view of a known circuit structure concerning a voltage divider 1 including a first set 2 of resistive components biased by a first (e.g., higher) reference voltage level VH and a second set 3 of resistive components biased by a second (e.g., lower) reference voltage level VL.

Some of the resistive components are connected to the higher reference voltage source VH through a switch SWH while some other resistive components are connected to the second lower reference voltage source VL through a switch SWL. Switches SWH and SWL may be representative of switches present on each branch of the circuit (not shown). Each component has its own switch.

Such a circuit 1 represents a resistive voltage divider, between the voltage reference VH and the other voltage reference VL, including a series of "n" paralleled resistive components and "M-n" paralleled resistive components, where M is the total number of resistive components, and "n" varies between 0 and M according to the DAC input code. Usually M is a power of 2 minus 1 and the DAC output has M+1 configurations.

The example of the TDAC shown in FIG. 1 has been provided adopting M=8 and n=2; however, in a more complex configuration with M=63 an ideal linear output may be defined by the line 20 reported in the diagram of FIG. 2. In FIG. 2 the Input Code value is represented on the horizontal axis, while the corresponding TDAC output voltage is represented on the vertical axis. As it may be appreciated, we have assumed that the 64 configurations of an ideal TDAC have a linear input to output relation. In fact, the value M=63 is only provided for the present explanation but shall not be considered a limiting factor. Moreover, output voltage ranging from VL (e.g., when all resistive elements are coupled between VL and OUT) to VH (e.g., when all resistive elements are coupled between VH and OUT); all resistive elements are assumed to be equal in this example.

FIG. 3 represents only the possible real response of the TDAC circuit, as depicted by the following disclosure, including the 63 resistive components and the curved line 30 is indicative of the drift from the ideal values 20. Such a deviation may be ascribed to process variability in some cases, as described below.

For example, the 63 resistive components (+1 for the "closure") of real TDAC circuit may be laid out and represented by a square matrix 8×8 shown in FIG. 4. Due to lack of uniformity during processing, respective actual resistance values of each resistive component may increase from the first top row to the last bottom row, for example. The assumption of a preferential gradient is for explanation only. In fact, it is usually unknown to the producer. Finally, the number in the matrix describe the sequence of the resistive components commutations from VL to VH.

The square 8×8 matrix shown in FIG. 4 also includes numbers that represent the sequence by which the coupling of each resistive component is switched from the lower reference VL to the higher reference VH (the other node remaining coupled to OUT). Initially (input code=0) all components are biased at VL, then the first (i.e., the number 0) resistive component R0 is switched to VH (input code=1), next the second resistive component R1 is switched to VH (input code=2), and so on.

The side arrow represents the topological gradient of this example affecting the resistive components of a non-ideal TDAC circuit. The process gradient is unknown before the semiconductor device is manufactured and could vary among different lots and/or wafers and/or positions on the same wafer, either in terms of intensity and in terms of direction.

The input to output characteristic response represented by the curved line 30 in FIG. 3 has been obtained just with the matrix distribution of the resistance values shown in FIG. 4 and the deviation of the curve line 30 is evident if compared with the ideal linear case of the line 20.

The maximal deviation for this example is 258 A.U. [arbitrary units] representing an undesirable high variability which may lead to the degradation of the performance of the electrical circuits.

As an alternative, we may consider that there are various cases which can be taken in consideration and wherein the sequence by which each resistive component is switched from the lower reference VL to the higher reference VH. For instance, FIG. 5 represents a case wherein the order of switching of the square 8×8 resistive component matrix is mirrored for improving the process, the electrical variations by mechanical stress or the electrical bias dependence of the device characteristics.

Figure 6:
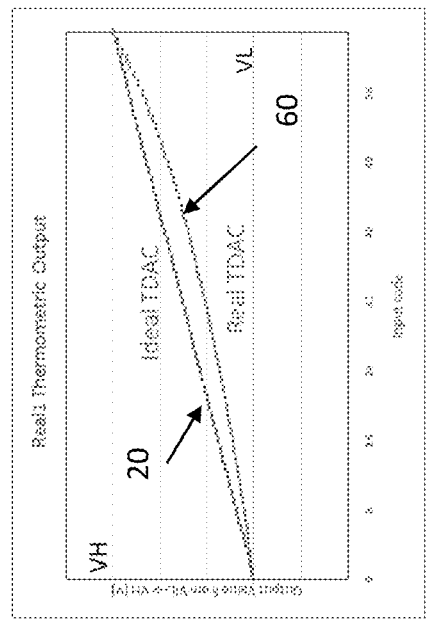
FIG. 6 shows a schematic diagram referred to FIG. 5 and illustrating a possible real output response of a TDAC circuit device including at least 63 resistive components when biased according to predetermined input values.

FIG. 6 is a diagram like the diagram of FIG. 3 and represents the TDAC response of the square matrix shown in FIG. 5 with a mirrored order of switching. The diagram compares the resulting input to output characteristic curved line response 60, obtained from the real resistances of the TDAC resistive components, with the ideal case previously discussed is still represented by the line 20. The maximal deviation in this case is 254 [arbitrary units] representing a decrement of a very negligible variability in the electrical circuit and thus providing no significant improvement.

Extending the previous considerations, the Applicant has tested the possibility to vary the sequence order of the resistive components switching, for instance from a selection that we may define "orthogonal" to the process gradient to a selection that may be considered "parallel" to the process gradient.

Figure 7:
FIG. 7 shows a further square matrix 8×8 wherein the sequence order of the resistive component switching has been varied if compared with the examples of FIGS. 4 and 5.

FIG. 7 represents a schematic example wherein the sequence order of the resistive component switching has been varied. Previously, with reference to FIGS. 4 and 5, the sequence order of the resistive component switching was orthogonal to the process gradient. In this further example of FIG. 7 the sequence order of the resistive component switching is made parallel to the process gradient.

Figure 8:
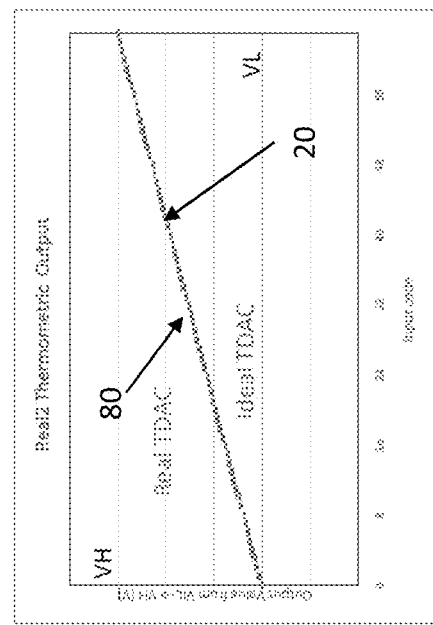
FIG. 8 shows a schematic diagram referred to FIG. 7 and illustrating a TDAC possible real response of the transposed square 8×8 resistive components matrix of FIG. 7.

FIG. 8 shows the TDAC response of the varied sequence order of the resistive components as shown in FIG. 7 thus obtaining an input to output characteristics depicted by the line 80 that is compared in that diagram with the usual ideal case input to output characteristics depicted by the line 20. As it may be appreciated, this variation of the sequence order of the resistive component provides a good improvement with maximum deviation of 32 A.U. [arbitrary units] only, such a variation is dependent on the orientation of the process gradient which is however unknown in the real world.

Figures 9, 10:
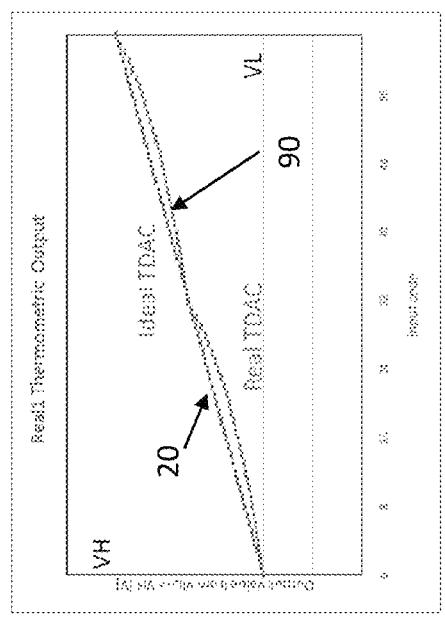
FIG. 9 shows a further square 8×8 resistive component matrix wherein another interleaved switching sequence is adopted.
FIG. 10 shows a schematic diagram referred to FIG. 9 and illustrating a TDAC possible real response of the interleaved square 8×8 resistive component matrix of FIG. 9.

FIG. 9 represents a further square 8×8 resistive component matrix wherein another interleaved switching sequence is adopted. When half of the resistive components are biased by the upper reference voltage (VH) and half are biased by the lower reference voltage (VL) in a symmetrical configuration the output yield by this sequence is overlaid on the ideal output. The TDAC response of the interleaved switching sequence is shown in FIG. 10 and depicts that the curve 90 is similar to the ideal line 20. The curve 90 here represents the obtained input to output characteristics while the line 20 represents as usual the ideal case of the input to output characteristics. This picture is very similar to the result of experimental outcome of silicon TDAC designed by the Applicant aside of other circuital limitations that move the "middle" point and dirty the "ends" of the curves.

The adopted gradient intensity previously disclosed has been chosen according to the Applicant's testing activity but could be different in other cases.

The previously disclosed cases show that the sequence order in which the resistive components are switched from one voltage reference to the other have a clear impact on the displacement of the real TDAC response with respect to the ideal TDAC response.

However, if the process gradient was known a proper resistive component sequence could reduce the TDAC displacement from the ideal TDAC case, for instance like in the example of FIG. 8 in which a maximal deviation of 32 [arbitrary units] has been obtained.

Unfortunately, in real cases the orientation of the process gradient is unknown and usually unpredictable and none of the prior switching sequence methods provides a solution to bypass this problem.

Hence, in consideration of the above-mentioned problem there is a need for a method to generate a sequence order of resistive components that is process gradient direction agnostic and hence is not affected by the orientation of the process gradient.

The solution proposed by the present disclosure overcomes the drawbacks of the previous methods and suggests generating a sequence order of the resistive components that is process gradient direction agnostic through a checkerboard/negative-checkerboard pattern that has a capability to reach an ideal output response without the knowledge of the orientation of the process gradient.

The present disclosure claims a method to generate a sequence order of resistive component that is process gradient direction agnostic through a checkerboard/negative-checkerboard pattern that has a capability to approach an ideal output without the knowledge of the orientation of the process gradient.

Moreover, the present disclosure claims, a method to provide a compensation technique with respect to process variability. The method utilizes an algorithm for arrangement of elements to bypass process gradient problem. In one of arrangement of circuital elements, the problem of orientation of process gradient is minimized to reduce output variations.

Furthermore, present disclosure claims a method to generate a switching sequence that is gradient direction agnostic. According to the method, a sequence of electrical components (as the resistive components in former explication example) that has been used where checkerboard (positive and negative) topology is being implemented to calculate parameter variations from ideal case.

The method is based on a matrix representation of device topology with the cells representing intrinsic characteristics of an electric component of the device. The matrix is then considered as a group of surrounding circles starting from a central core portion and relates on staying on whatever circle, choosing whatever resistive component on that circle, considering that the closer neighbor resistive components on the circle are those most similar in resistance to the chosen resistive component and then follows the resistive components neighbors of the former neighbor resistive components and so on to achieve process gradient agnostic approach.

Figure 11:
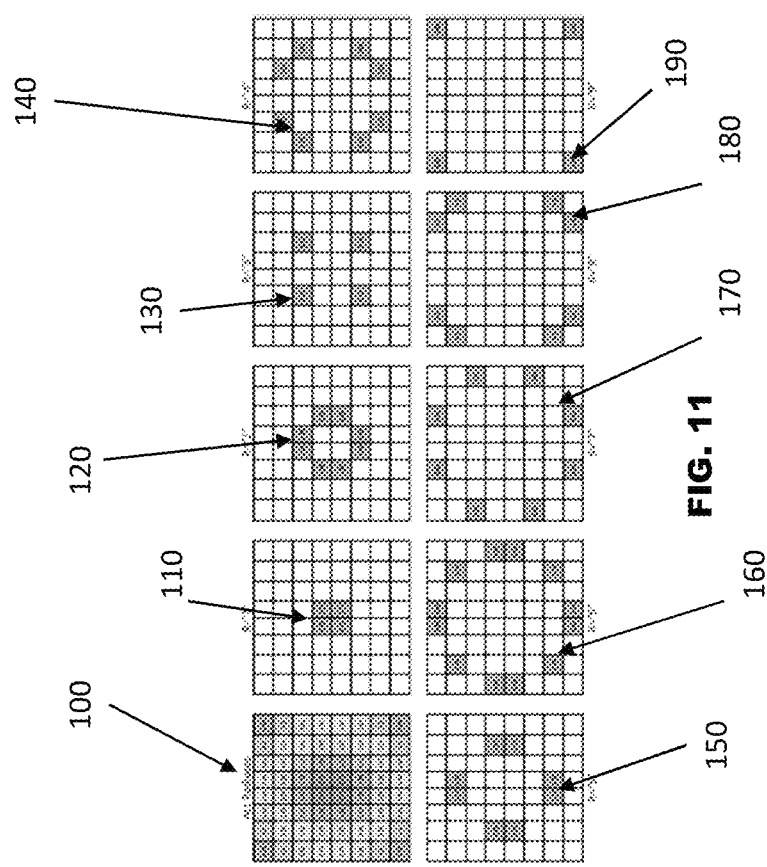
FIG. 11 shows a plurality of matrix representations indicative of the layout or topology of an electric device realized on silicon and wherein each cell represents an electric component (having an intrinsic characteristic, for instance a resistive value) having the same distance from the matrix center, according to embodiments of the disclosure.

Making now reference to the example of FIG. 11, it may be appreciated that the first square 8×8 resistive components matrix 100 may be considered as a checkerboard (positive or negative according to the situations) wherein each cell represents an electrical or resistive component having a real resistive value R derived by the manufacturing process on silicon.

In this respect it is possible to identify a radius RD of concentric circles expanding from the central point of the matrix and variable by arbitrary units A.U. assuming a matrix of square cells of unit side.

A first matrix 100 in the left end corner of FIG. 11 shows with a colored circular-symmetric gradient a group of concentric circles formed by cells having a same distance D from the central point of the matrix. Such a distance D is of course variable according to the expansion of the circles of cells and we will refer hereinafter to different distances with a plurality of numbered reference signs $d_1, d_2, \ldots, d_N$.

The inner four cells in the matrix core are equally distant from the central point of the matrix and this first distance $d_1$, may be identified by half diagonal, for instance: SQR[$(A.U./2)^2+(A.U./2)^2$] with the previous assumption of unity cell's side.

Similarly, each cell in each of the surrounding circles has a distance $d_2, \ldots, d_N$ that is the same for all the other cells of the same circle.

All electrical or resistive components are designed to have the same resistance value R, in this example. However, as consequence of processing, each component will have an actual resistance value that differs from the designed one by a variation that depends on the gradient (both direction and amplitude) and the distance $d_1, d_2, \ldots, d_N$. (also considering direction).

In the subsequent matrixes reported in FIG. 11 the cells have been reported as organized in circles starting from the core portion of the central four cells previously mentioned as having a first distance $d_1$ from the central point of the matrix. This core portion is indicated with the number 110 wherein all the four cells have the same distance $d_1$ from the matrix center, for instance a spatial distance of value of 0.71 A.U.

The cells of the core portion 110 may be considered part of a first circle having a first radius RD1.

If we consider the eight cells located around this central core portion 110, we may define this second group of cells as a second circle 120 surrounding the core portion 110. The cells of this second circle have all the same distance $d_2$ from the central point of the matrix, for instance a value of 1.58 A.U., and may be considered part of a second circle having a second radius RD2.

Proceeding in this manner from the central portion toward the periphery of the array we may identify groups of cells that may be considered part of an external circle having a higher radius RD3, RD4, . . . , RDN.

For instance, the four cells located at the corners of a third circle 130 represent a common group located at a distance $d_3$ from the central point of the matrix or, in other words, positioned at a radius RD3 from the matrix center.

The common characteristic of the cells that are part of a circle is the same distance D from the central point of the matrix, see for instance the cells of the third circle 130 having a radius RD3 and a common distance $d_3$ from the central point of the matrix of value 2.12 A.U.

Similarly, we may proceed to identify other external circles with electric or resistive components having the same distance $d_i$ from the central point of the matrix if compared with a more internal circle. See for instance a fourth circle 140 having radius RD4 and with resistive components positioned at a distance $d_4$ having a value 2.92 A.U.

FIG. 11 shows the other remaining circles that have been identified as: a fifth circle 150 having radius RD5 and with a distance $d_5$ from the central point of the matrix having a value of 2.55 A.U.; a sixth circle 160 having radius RD6 and with a distance $d_6$ from the central point of the matrix having a value of 3.54 A.U.; a seventh circle 170 having radius RD7 with a distance $d_7$ from the central point of the matrix having a value of 3.81 A.U.; an eighth circle 180 having radius RD8 with a distance $d_8$ from the central point of the matrix having a value of 4.3 A.U. and a final ninth circle 190 having radius RD9 with a distance $d_9$ from the central point of the matrix having a value of 4.95 A.U.

The method of the present disclosure does work with any linear gradient of unknown orientation; the principle is based on switching the elements starting with the elements of inner core 110, e.g., the cells that are very similar in resistance because very close to each other and then proceeding with cells on progressively increasing radius circles (jumping on diameters) adding then the cells that are deviating in opposite way, whichever the (liner) gradient is. This principle will be further explained with reference to a subsequent FIG. 16.

Figure 12:
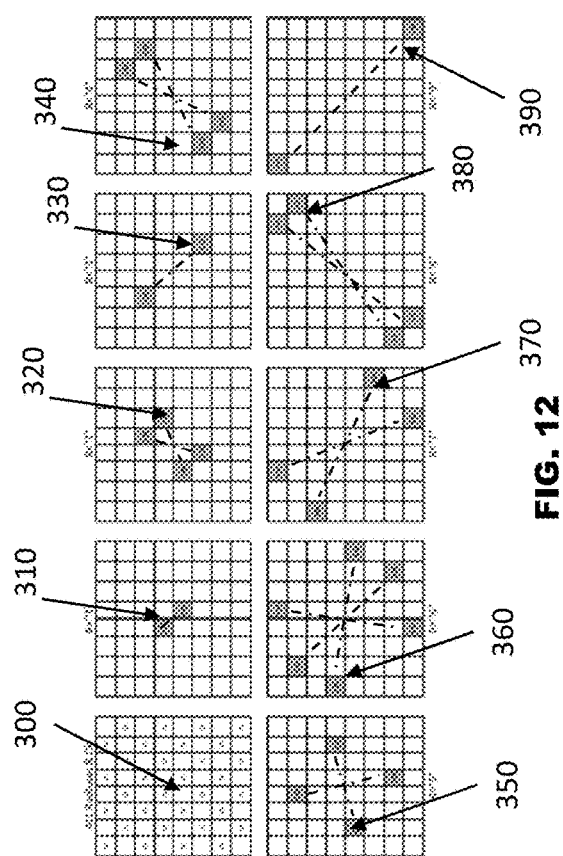
FIG. 12 shows a plurality of matrix representations illustrating in a checkerboard, named positive, a subset of resistive components having same distance from the center of the matrix, according to embodiments of the disclosure.
Figure 13:
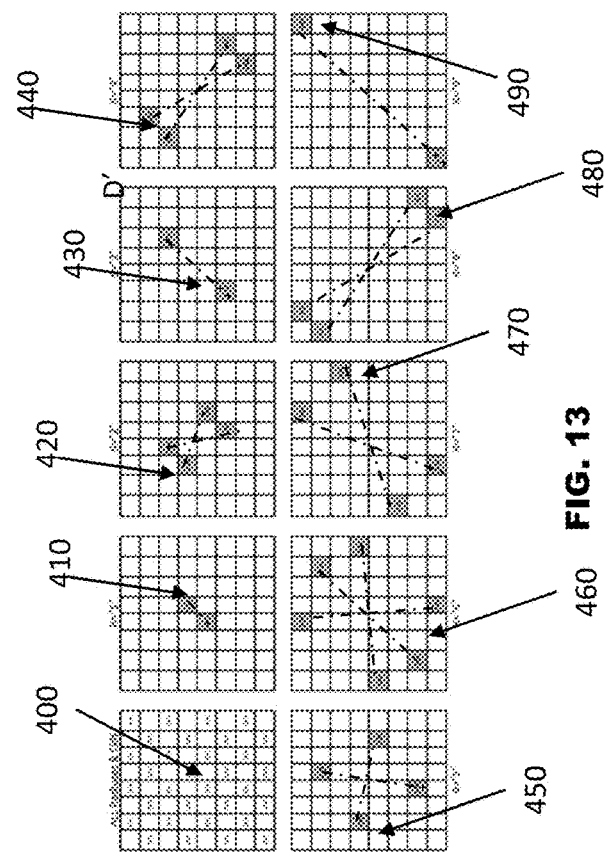
FIG. 13 shows a plurality of matrix representations illustrating in a checkerboard, named negative, a subset of resistive components having same distance from the center of the matrix, according to embodiments of the disclosure.

Focusing now our attention on the examples of the FIGS. 12 and 13, we may appreciate that the same square 8×8 resistive components matrix may be examined under a different point of view and more particularly splitting the cells of the former circles in two main groups including positive checkerboard and negative checkerboard resistive values, respectively.

FIG. 12 represents splitting out the resistive components picking out the resistive components belonging to a positive checkerboard. The positive checkerboard topology has been depicted with varying radius.

Similarly, FIG. 13 represents splitting out the resistive components picking out the resistive components belonging to a negative checkerboard. The negative checkerboard topology has been depicted with varying radius.

For instance, the square 8×8 resistive components matrix 300 shown in FIG. 12 includes only positive checkerboard electric components. The other matrixes of FIG. 12 shows only couples of cells that are located at the same distance D from the central point of the matrix and that are selected in the switching sequence of the disclosed method.

The other matrixes shown in FIG. 12 reports the various circles previously disclosed with reference to FIG. 11 and having radius from RD1 to RD9 but including only the positive checkerboard resistive values.

In other words, the number 310 serves to indicate the cells of the first circle having radius RD1 and located on a distance $d_1$ from the central point of the matrix (e.g., the cells in the core of the matrix). The number 320 is indicative of the cells of the second circle having radius RD2 and located in the positive checkerboard at the distance $d_2$ from the matrix center. These cells may be paired according to the respective position being symmetric with respect to the matrix center. Paired cells will be switched in sequence to optimize linear output.

The other matrixes shown in FIG. 12, from 330 to 390, reports the various circles with increased radius with the respective cells located on the positive checkerboard. Cells in each circle may be paired according to the respective position being symmetric to the matrix center. Paired cells will be activated in sequence to optimize linear output.

Similarly, FIG. 13 shows a square 8×8 negative checkerboard matrix 400 of electric or resistive components. The other matrixes of FIG. 13 shows only couples of cells that are located at the same distance D from the central point of the matrix and that are selected in the switching sequence of the disclosed method.

In this FIG. 13 the number 410 serves to indicate the cells of the first circle having radius RD1 and located on a distance d1 diagonal D from the central point of the matrix (e.g., the cells in the core of the matrix). The number 420 is indicative of the cells of the second circle having radius RD2 and located in the negative checkerboard at the distance $d_2$ from the matrix center. These cells may be paired according to the respective position being symmetric with respect to the matrix center. Paired cells will be switched in sequence to optimize linear output.

The other matrixes shown in FIG. 13, from 430 to 490, reports the various circles with increased radius with the respective cells located on the negative checkerboard. Cells in each circle may be paired according to the respective position being symmetric to the matrix center. Paired cells will be activated in sequence to optimize linear output.

To be completely clear, in the non-limiting example disclosed herewith with respect to electric components having a specific resistive characteristic with an intrinsic resistive value, each element in the cell of the matrix is switched starting from the elements of inner core (i.e. the cells that are very similar in resistance because very close to each other) then proceeding with cells on progressively increasing radius circles (jumping on the opposite cell located at the same distance from the matrix center) adding then the cells that are deviating in opposite way, whichever the gradient is.

The previous considerations may be expressed also in a different manner.

If we consider the first central group or circle of cells 110, 310 or 410 as a first reference of electric components having an intrinsic resistive value and the other resistive components laying on any diameter of the first central circle we may realize that there is a difference in these resistive values, with respect to the average RD value, and this difference is given by +DR and −DR, where DR can vary from zero to DRmax (>0, according to the position of the cells, e.g., both the radius of the circle and direction).

Then, if we consider any other possible circle previously identified by the radius RD (from RD1 to RD9) we may realize that staying on whatever circle and chosen whatever resistive component on that circle, the resistive component closer to the chosen resistive component is the one having most similar value in the resistive value.

This evidence appears from the previously reported matrix representation including real values of each next neighbors resistive components located on the external circle surrounding the one taken in consideration. This is true from the central portion to the periphery but also in the opposite direction.

In the following we describe the method of the present disclosure.

Firstly, a "middle sequence" interleaved pattern for interconnecting the components can be adopted so that the specific configuration is by construction symmetrical to whatever gradient due to the process variables thus yielding a better performance even for reaching an ideal output starting from an unknown direction topological gradient.

Secondly, the sequence may proceed on the selected circle along diagonal lines indicated in the drawings with dotted lines connecting ideally opposite cells located at the same distance from the matrix center for selecting the best resistive value for compensating the previous element in the interconnection sequence, since the two opposite elements of these cells are affected by the same and opposite deviations from an average resistive value.

In view of the above considerations and according to one of the preferred embodiments, a method is disclosed to provide a compensation technique with respect to process variability. The method utilizes a switching or an interconnection sequence for interconnecting the electric components of the circuit device to compensate process gradient problem. In one arrangement of the circuital elements the problem of orientation of process gradient is minimized to reduce output variations, this is reported in the flow chart of FIG. 19.

According to one embodiment of the present disclosure it is disclosed a method for compensating electrical device variabilities in configurable output circuits comprising:

coupling a first set of electric components to a common node;

coupling a second set of electric components to the common node;

selecting and interconnecting some electric components of the first set to a first reference voltage and some electric components of the second set to a second reference voltage to provide a variable output at the common node between said second and first reference voltages based on a configuration;

implementing an interconnecting sequence of said electric components based on an intrinsic characteristic of said electric components and according to an agnostic gradient direction of the physical location of the electric components.

The electric components in the disclosed example are resistive components and said intrinsic characteristic is the resistive value of the component. However, nothing refrains from using other electric components such as capacitive or inductive components, in such a case the corresponding intrinsic characteristic will be the capacitance or inductance, respectively.

Just as an example, an electric device to whom the method may be well implemented is a TDAC (Thermometric Digital to Analog Converter); however, other circuit device may adopt the compensation method of the present disclosure.

In a further embodiment of the present disclosure the method relates to a compensating technique for electrical device variabilities in configurable output circuits comprising:

representing the electric device layout and topography as a matrix of cells each representing an electric component having an intrinsic characteristic value;

identifying in said matrix a plurality of surrounding circles of cells having increasing radius starting from a central first circle including a first squared group of cells;

selecting and interconnecting the electric components represented in the matrix according to an interconnecting sequence that is agnostic to gradient direction of the physical topographical location of the electric components.

Another embodiment of the present disclosure relates to an electric device or circuit including a plurality of electric or electronic components realized on a semiconductor substrate and having an intrinsic characteristic, comprising:

a first set of electric components coupled to a common node, the common node configured to provide an output;

a second subset of second electric components coupled to the common node;

said electric components being interconnected to a first reference voltage or to a second reference voltage according to a sequence based on an agnostic gradient direction of the physical topographical location of the electric components thus limiting the manufacturing process variabilities. In some embodiments the first reference voltage is a higher voltage than the second reference voltage. In some embodiments the second reference voltage is a ground voltage. In some embodiments the output is a variable output voltage between the second and the first reference voltage. In some embodiments the electric components comprise one of a resistor, a capacitor or an inductor. In some embodiments the electric components have a same nominal value, e.g., comprise resistors with same resistance other than process-related resistance variations.

In one of the embodiments, it is disclosed a method to generate a switching or an interconnecting sequence of electric components that is gradient direction agnostic and reduces dramatically the possible manufacturing process variabilities affecting said electric components.

The method firstly suggests defining a matrix of cells representing the electric device layout and topography and wherein each cell represents an electric component having an intrinsic characteristic, for instance a resistive value. Then, starting on whatever circle representation of electric components, choosing whatever intrinsic characteristic of the chosen electric components, for instance the resistive value of that specific component, selecting and interconnecting the closer neighbor component having the most similar characteristic value, for instance the resistive value on the diagonal crossing externally that circle, continuing in the selection and interconnection of the neighbors components of the more external circle and so on up to the end of the matrix to achieve a process gradient agnostic approach.

Figure 14:
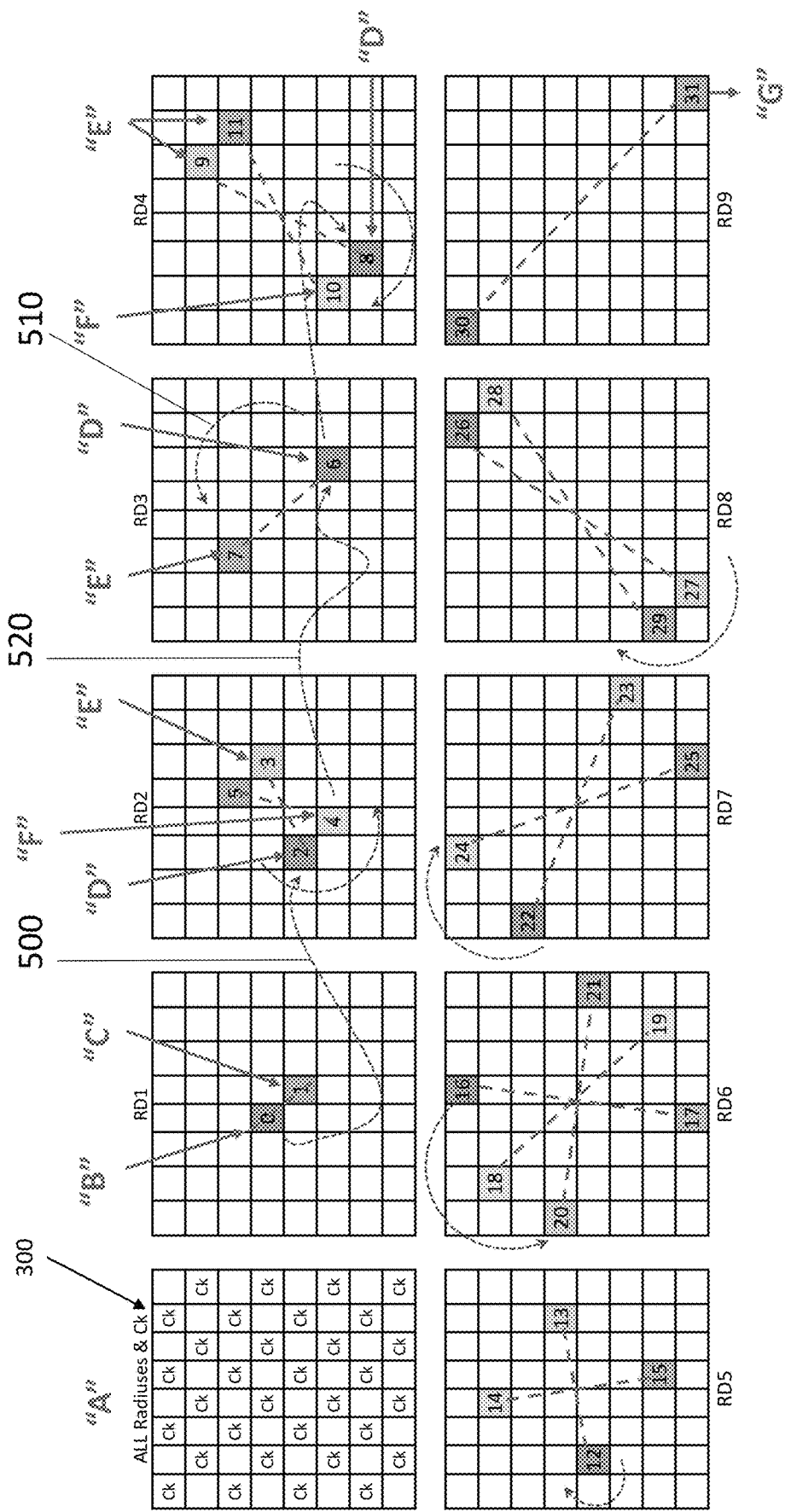
FIG. 14 shows the plurality of matrix representations of FIG. 12 to which the interconnecting sequence method of the present disclosure is applied, according to embodiments of the disclosure.
Figure 15:
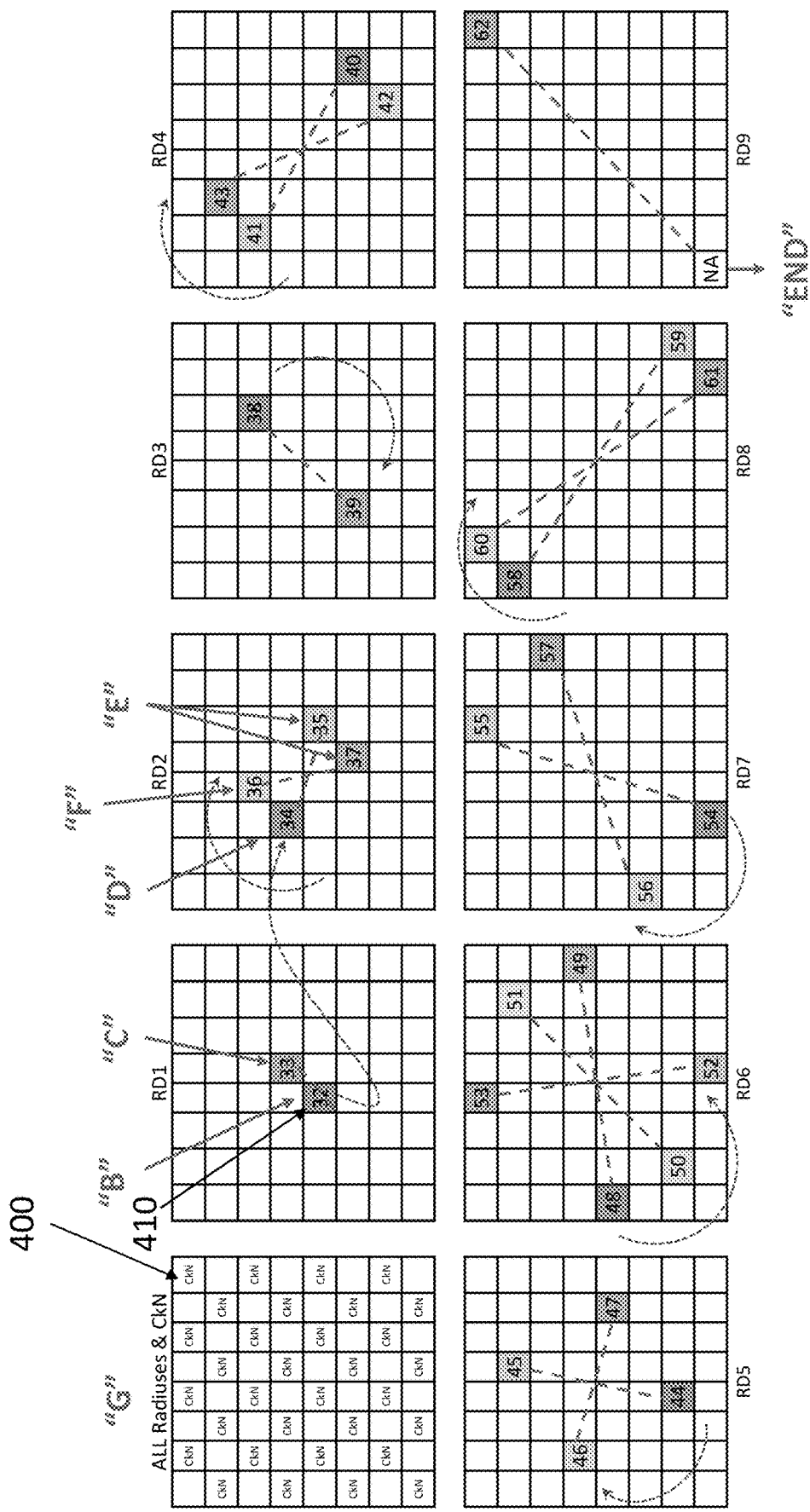
FIG. 15 shows the plurality of matrix representations of FIG. 13 to which the interconnecting sequence method of the present disclosure is applied, according to embodiments of the disclosure.

These and other aspects of the embodiments herein will be better appreciated and understood when considered in conjunction with the following description and the examples of the FIGS. 14 and 15.

A systematic approach is implemented to bypass problem of process gradient and introduce the compensation technique of the present disclosure for configurable-output circuits.

Figure 19:
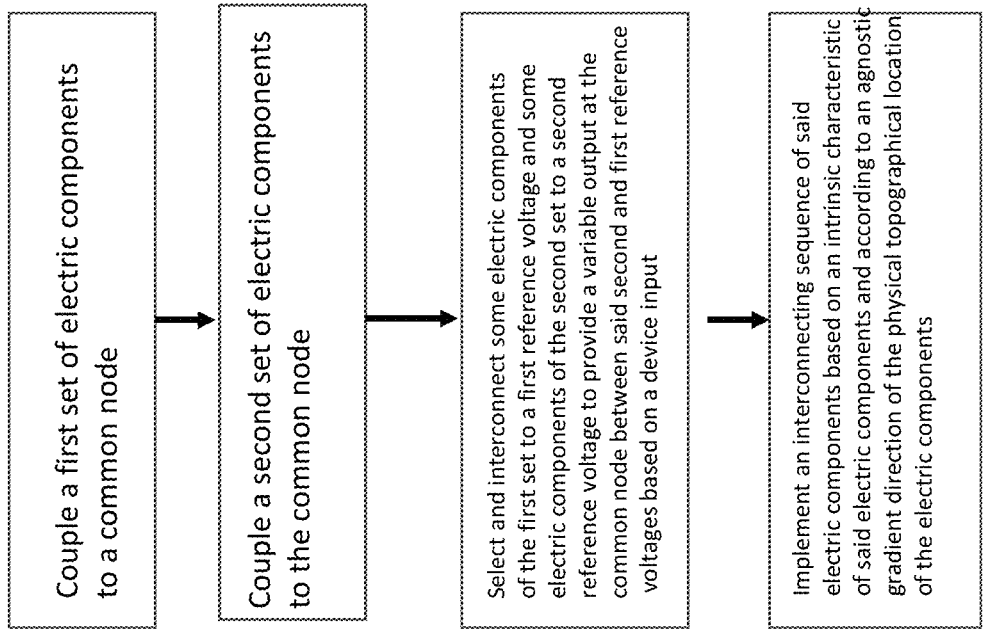
FIG. 19 shows a diagram with a flow chart illustrating an example method steps of the present disclosure.
Figure 20:
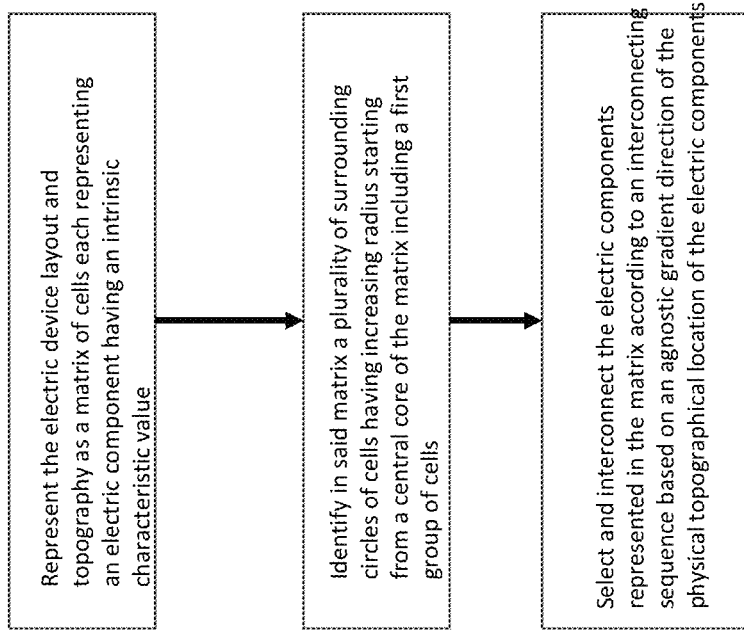
FIG. 20 shows a further diagram with a flow chart illustrating alternative method steps according to embodiments of the present disclosure.

FIG. 19 shows a method to generate a switching sequence that is gradient direction agnostic.

First, if a "middle sequence" interleaved pattern that is parallel to the gradient can yield a better performance than a "middle sequence" checkerboard/negative-checkerboard pattern can reach an ideal output for an unknown direction topological gradient.

Secondly, if we consider the center of the rectangle that allocates the resistive components we can say that the resistive components oppositely laying on any diameter of a circle centered in the center of the rectangle have a difference in values with respect to the average R value equal to +DR and −DR, where DR can vary from zero to DRmax (>0, according to the position of the cells, e.g., both the radius of the circle and the direction).

Finally, staying on whatever circle for what said in the former point, chosen whatever resistive component on that circle, its most close neighbor resistive components are the ones most similar in resistance to the chosen resistive component, then follow the resistive components neighbors of the former neighbor resistive components and so on.

For a better understanding of the methodology, let's start in a first step "A" from the matrix checkerboard 300 of FIG. 14 wherein the group of resistive components has been split out in subsets of resistive components characterized by having the same distance from the center of the central area, or central core, hosting the first circle of resistive components. Different subsets ranging from RD1 to RD9 have been represented and shown by grid diagrams.

FIG. 14 presents an overview of the method steps of most convenient switching and/or interconnecting sequence for the electric components here taken in consideration, that is to say: the resistive components of the disclosed example.

Starting from the most inner circle of the positive checkerboard Ck subsets of the matrix 300 we may select as second step "B" a resistive component of the main diagonal line as the first switching element and interconnect as third step the opposite resistive component on the same diagonal line of the same circle with RD1

Having selected the second component of the interconnection sequence the method suggests coming back the same circle but in this first passage all the resistive components have been covered.

Therefore, the sequence proceeds on the following or surrounding circle selecting the resistive component that is the closest to the former initial resistive component. This is evidences in FIG. 14 with the curved dotted arrow 500 indicating a passage to a circle having larger radius.

Thus, a new circle with radius RD2 has been reached in a fourth step "D" and the algorithm proceeds in selecting the symmetric (with respect to the center of the matrix) resistive component located on the diagonal line on the opposite side of the same circle; see in the FIG. 14 the step "E".

The above passages is repeated for all remaining components of that circle.

Therefore, on the same circle the next component to be selected is the one diagonally opposite to the last selected component. Then, jumping or coming back on the same circle, it will be selected the next closest component before the diagonal jump, according to a convenient rotation direction (clockwise or counterclockwise), see for instance the counterclockwise curved dotted arrow 510 indicating the selection of a subsequent cell on the same circle. FIG. 14 presents also sequence example for the resistive component's checkerboard subsets with rotation inversion when convenient.

This passage is evidenced by the sixth step "F" In FIG. 14, resulting in selection of component in cell 4.

Once the cells of a circle are completed (e.g., further selecting cell 5, symmetrically located on the same diagonal as cell 4), the selection passes to the next surrounding circle as shown by the dotted arrow 520 indicating a passage to a circle having larger radius.

The procedure is repeated for all the other cells (and corresponding components) of a same circle thus repeating the steps "D", "E" and "F".

The procedure will proceed in this manner up to the point wherein all the available resistive components (i.e. cells) of the positive Ck subsets are completed, thus reaching step "G" Reported in the last bottom right corner of the matrix 300.

Then, the selection passes or continues in step "G" with the other negative checkerboard wherein the switching sequence proceeds with a new second step "B" applied on the negative checkerboard 400 shown in FIG. 15 starting from two remaining negative cells 410 of the core inner four cells.

Here, starting again from the most inner circle of the negative CkN subsets of the matrix 400 we may select as third step "C" a resistive component of the main diagonal line as the first switching element and interconnect to the opposite resistive component on the same diagonal line of the same circle with RD1.

Then, a new circle with radius RD2 is reached in a fourth step "D" and the algorithm proceeds in selecting the opposite symmetric (with respect to the center of the matrix) resistive component located on the diagonal line on the opposite side of the same circle; see in the FIG. 15 the fifth step "E".

FIG. 15 presents also sequence example for the resistive component's negative checkerboard subsets with rotation inversion (clockwise) when convenient.

The whole procedure is thus repeated similarly for all the CkN subsets for reaching in step "END" The last bottom left cell of the matrix 400. The algorithm stops when all the resistive components of the TDAC are crossed out.

Figure 16:
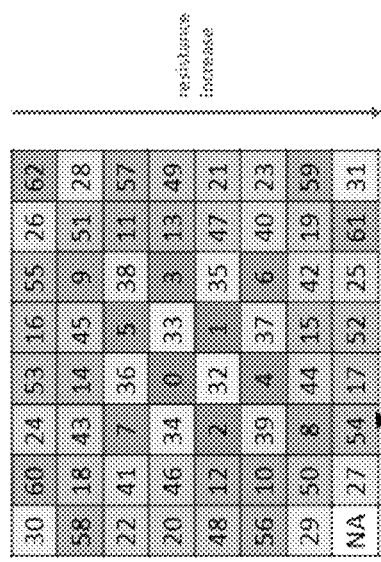
FIG. 16 shows a final representation of a matrix reporting the sequence of the interconnected cells wherein each cell number represents the order of the interconnecting sequence obtained with the method of the present disclosure, according to embodiments of the disclosure.

FIG. 16 shows a final representation of a matrix 600 reporting the sequence of the interconnected cells. Each cell number represents the order of the interconnecting sequence, e.g., the switching of electric component in respective cell from a low reference voltage to a high reference voltage (VL and VH n FIG. 1, for example), obtained with the method previously disclosed.

Figure 17:
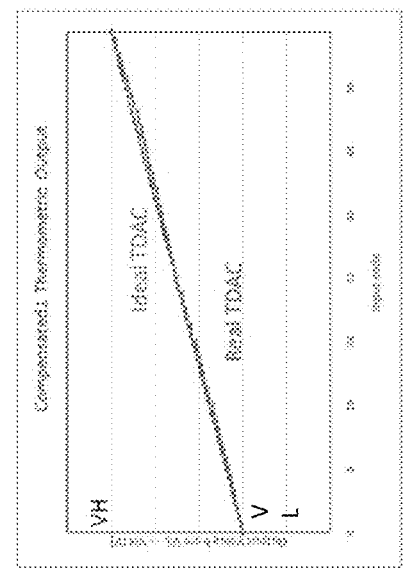
FIG. 17 illustrates a TDAC real response of the gradient-direction agnostic best sequence case adopted interconnecting the electric components of the electric device according to the matrix shown in FIG. 16, according to embodiments of the disclosure.

FIG. 17 shows a graphical representation of a real TDAC output vs. an ideal TDAC output based on the sequence shown in the matrix of FIG. 16. It may be appreciated that the result is particularly close to the ideal value since the two lines are substantially overlapping since the variability of the electric components has been compensated.

Figure 18:
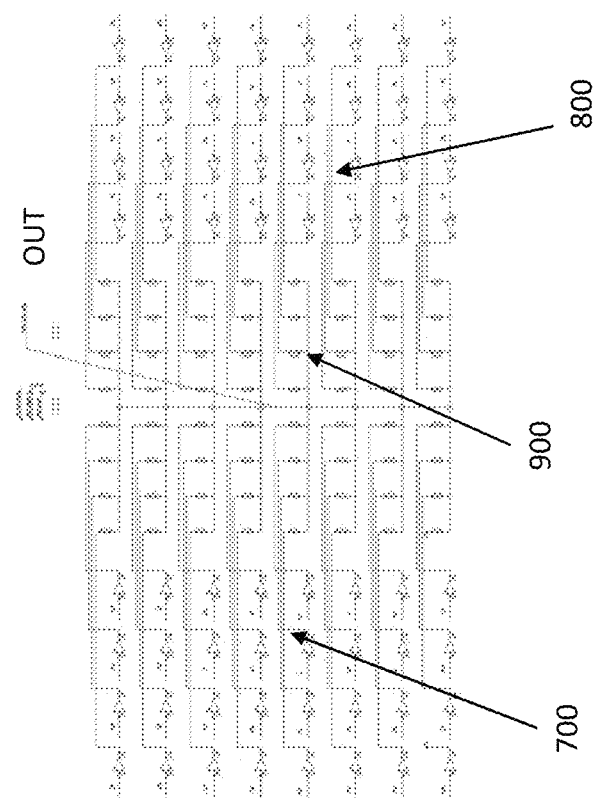
FIG. 18 is a schematic view of a layout example for an electric device obtained interconnecting the electric components according to an example sequence of a method of the present disclosure.

FIG. 18 shows a schematic view of an example illustrating an integrated circuit device realized on a semiconductor substrate and having a plurality of electric components that have been interconnected according an agnostic gradient direction of their physical topographical variation in line with the method of the present disclosure.

FIG. 18 shows resistive components, however the circuit can be realized with inductive of capacitive components or a mixture of them. On both sides of the central portion 900 of resistive components arranged as in a rectangular or square matrix, as the matrix 100, there are circuit portions 700 and 800 including a plurality of inverters acting as switches for selectively interconnecting the various electric components to the first or to the second reference voltage values VH and VL. Each resistive component has one terminal coupled to a common node OUT and another terminal coupled to respective switch (an inverter in the example depicted).

The interconnection sequence of the electric components of the central matrix portion 900 is based on the method previously disclosed. Accordingly, inverters coupled to respective resistive components are sequentially activated so that the terminal of the corresponding resistor is switched from VL to VH starting from the resistors located in the central core of the matrix and followed by symmetric resistors in same circle and then by resistors in surrounding circles with increasing radius, according to the sequence described with reference to drawings 11-16. The variable voltage provided at the common node OUT changes between VL and VH based on the circuit input driving the inverters or switches.

It should be noted that while circuit portions are depicted in the periphery (e.g., at the left and at the right of central matrix portion 900), in other embodiments the disposition may be different; for example, inverters and/or switches may be positioned adjacent to respective component. It should be further noted that the method of the present disclosure could be implemented in a different manner. Instead of starting from the central core of the matrix of the positive Ck and negative CkN checkerboard patterns, it would be possible to start from the outer circles of the two patterns and proceed inwardly.

As a further alternative, it would be possible to start from central core portion of the matrix of positive Ck checkerboard pattern and reprise from the outer circle of the negative CkN checkerboard pattern.

Another possible alternative would suggest starting from the outer circle of the positive Ck checkerboard pattern and reprise from the inner circle (center) of the negative CkN checkerboard pattern or swap Ck and CkN for any of the above possibilities.

Moreover, also within a selected pattern the initial resistive component to switch is not unique. All these procedures give the same results, they can vary according the real gradient direction and the TDAC design (i.e.: if the resistive components are initially all connected to VL and at the end all connected to VH or vice versa)

Process/mechanical/bias gradient driven electrical variations of components of circuits meant to realize an output varying between two extremes deviates the expected result with respect to the theoretical input and output curve in relation to the intensity of the variation gradient.

The presented method/algorithm/technique can be as much as four times better than a generic "natural" switching sequence.

The proposed method, in its more general terms, relies on the fact that when moving in sequence the electrical components of the configurable-output circuit from one reference source to the other it is convenient to alternatively move one component with a certain variation followed by one with the opposite variation of similar intensity trying to minimize the variability of the absolute variation as common rule.

In this way the composition of the electrical behavior of the different components tend to average out instead of, potentially, reinforce each other.

Under this strategy the proposed method is a reasonable way to obtain a better working configuration with respect to a "naturally drawn" design.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments.

It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A device, comprising:
    an output node; and
    a plurality of electric components configured in an area of a substrate and coupled to the output node, wherein the device is configured to connect the electric components, in a pattern based on distances from the electric components to a center of the area, to reference voltages to produce a range of voltages at the output node, wherein the pattern reduces deviation from a linear output for a plurality of gradient directions of variabilities in the electric components in the area.

2. The device of claim 1, wherein the device is configured to:
    connect a first subset of the electric components to a first reference voltage;
    connect a second subset of the electric components to a second reference voltage; and
    provide a variable output at the output node.

3. The device of claim 2, wherein the variable output is configured between the first reference voltage and the second reference voltage.

4. The device of claim 3, wherein the device is further configured to interconnect the electric components based on an intrinsic characteristic of the electric components.

5. The device of claim 4, wherein the electric components include a resistive component; and the intrinsic characteristic includes a resistance value of the resistive component.

6. The device of claim 4, wherein the electric components include a capacitive component; and the intrinsic characteristic includes a capacitance value of the capacitive component.

7. The device of claim 4, wherein the electric components include an inductive component; and the intrinsic characteristic includes an inductance value of the inductive component.

8. The device of claim 3, wherein the variable output is an analog signal generated according to a digital value.

9. A method, comprising:
    determining, for a plurality of electric components of a device, a sequence based on distances of the electric components from a center of the electric components;
    connecting, by the device, the electric components to reference voltages according to the sequence; and
    providing, by the electric components coupled to an output node of the device, an output signal.

10. The method of claim 9, wherein the connecting includes:
    connecting a first subset of the electric components to a first reference voltage; and
    connecting a second subset of the electric components to a second reference voltage;
    wherein the output signal is variable according to a digital input to the device.

11. The method of claim 10, wherein the output signal is between the first reference voltage and the second reference voltage.

12. The method of claim 11, wherein the electric components are interconnected based on an intrinsic characteristic of the electric components.

13. The method of claim 12, wherein the electric components include a resistive component; and the intrinsic characteristic includes a resistance value of the resistive component.

14. The method of claim 12, wherein the electric components include a capacitive component; and the intrinsic characteristic includes a capacitance value of the capacitive component.

15. The method of claim 12, wherein the electric components include an inductive component; and the intrinsic characteristic includes an inductance value of the inductive component.

16. An apparatus, comprising:
    a digital to analog converter, having:
        an output node; and
        a plurality of electric components coupled to the output node, wherein the converter is configured to connect the electric components, to reference voltages, according to a sequence that is based on a distances of the electric components from a center of the electric components.

17. The apparatus of claim 16, wherein the converter is configured to:
    connect a first subset of the electric components to a first reference voltage;
    connect a second subset of the electric components to a second reference voltage; and
    provide a variable output at the output node.

18. The apparatus of claim 17, wherein the variable output is configured between the first reference voltage and the second reference voltage.

19. The apparatus of claim 18, wherein the converter is further configured to interconnect the electric components based on an intrinsic characteristic of the electric components.

20. The apparatus of claim 19, wherein the intrinsic characteristic includes a resistance value, a capacitance value, or an inductance value of a component in the electric components.

* * * * *